Figure 1:
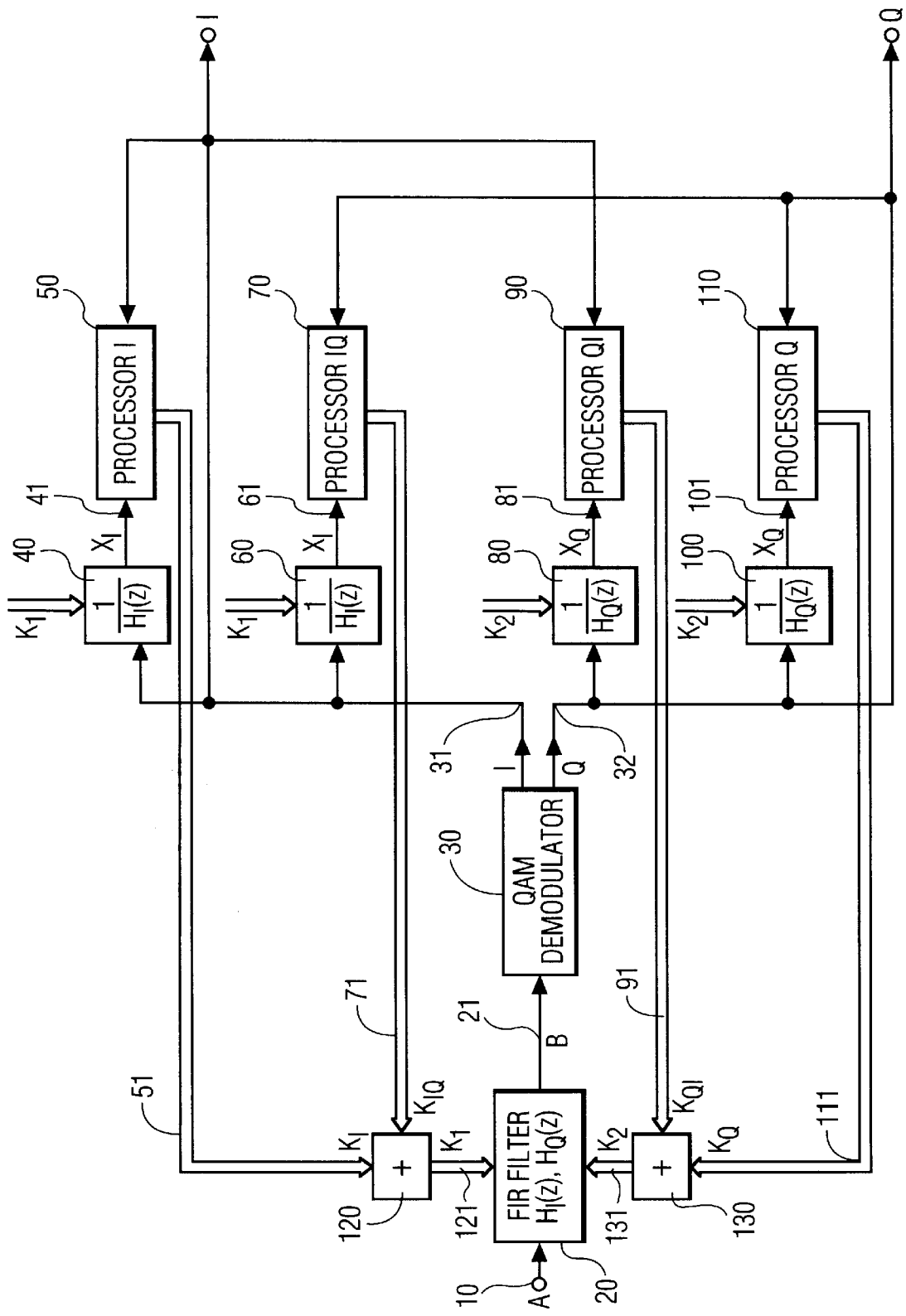

United States Patent

Dinsel et al.

[11] Patent Number: 6,028,895
[45] Date of Patent: Feb. 22, 2000

[54] DISTORTION CORRECTOR FOR TWO DATA FLOWS

[75] Inventors: Siegfried Dinsel; Gerhard Hans Herbert Schoeps, both of München, Germany

[73] Assignee: Deutsche Thomson-Brandt GmbH, Villingen-Schwenningen, Germany

[21] Appl. No.: 08/836,190

[22] PCT Filed: Nov. 14, 1997

[86] PCT No.: PCT/EP95/04472

§ 371 Date: Nov. 25, 1997

§ 102(e) Date: Nov. 25, 1997

[87] PCT Pub. No.: WO96/16495

PCT Pub. Date: May 30, 1996

[30] Foreign Application Priority Data

Nov. 17, 1994 [DE] Germany ............... 44 40 964

[51] Int. Cl.[7] .................................................. H04B 1/10
[52] U.S. Cl. .................... 375/235; 375/266; 375/350; 708/303; 708/322
[58] Field of Search .................................. 375/229, 235, 375/266, 346, 348, 350; 364/724.012, 724.16, 724.2

[56] References Cited

U.S. PATENT DOCUMENTS

| | | | |
|---|---|---|---|
| 4,247,940 | 1/1981 | Mueller et al. ...................... | 375/229 |
| 4,759,037 | 7/1988 | Debus, Jr. et al. ...................... | 375/235 |
| 4,831,637 | 5/1989 | Lawrence et al. ...................... | 375/235 |

FOREIGN PATENT DOCUMENTS 106136   4/1984   European Pat. Off. .

OTHER PUBLICATIONS

IEEE Pacific Rim Conf. On Communications, Computers and Signal Processing, W.E. Mattis "A Hybrid Fractionally Spaced Digitally Controlled Equalizer", pp. 482–486, Jun. 1–2, 1989.

Primary Examiner—Amanda T. Le
Attorney, Agent, or Firm—Joseph S. Tripoli; Ronald H. Kurdyla

[57] ABSTRACT

A system for equalizing an input signal including a datastream modulated on a carrier, with respect to both transmission channel distortions and local receiver distortions, includes a network for frequency downshifting the input signal, a controlled non-recursive filter (20) responsive to the downshifted input signal, and a demodulator (30) for receiving an output signal from the controlled filter. A signal processing network, including a filter network with a transfer function (40, 60, 80, 100) which is the inverse of the transfer function of the controlled filter, responds to an output signal from the demodulator for producing output control signals. The control signals are coupled to a coefficient control input of the non-recursive filter for equalizing the signal with respect to both transmission channel and receiver distortion.

3 Claims, 5 Drawing Sheets

DISTORTION CORRECTOR FOR TWO DATA FLOWS

DESCRIPTION

The invention relates to an arrangement for equalizing two data streams. Such an arrangement is disclosed in EP-0 179 393 B1.

Linear distortions, in particular echoes occur up to the receiver on the transmission path during the transmission of digital modulated telecommunication signals. Since the echoes can change with time, adaptive equalization must be performed. Furthermore, distortions within the receiver can occur in the demodulation path and must be taken into account during equalization. EP-0 179 393 B1 discloses for the purpose of equalization the use of a surface wave filter whose coefficients can be set adaptively. The surface wave filter is arranged upstream of the demodulation path. In order to calculate the coefficients it is normal for this purpose to compare the distorted carrier-frequency signal upstream of the surface wave filter with the equalized, carrier-frequency signal downstream of the surface wave filter. It is thus not possible to detect the distortions in the demodulation path.

The object of the invention is to equalize all signal interference occurring in the transmission path and in the receiver in the case of an arrangement of the type mentioned at the beginning.

This object is achieved according to the principles of the present invention.

Figure 3:
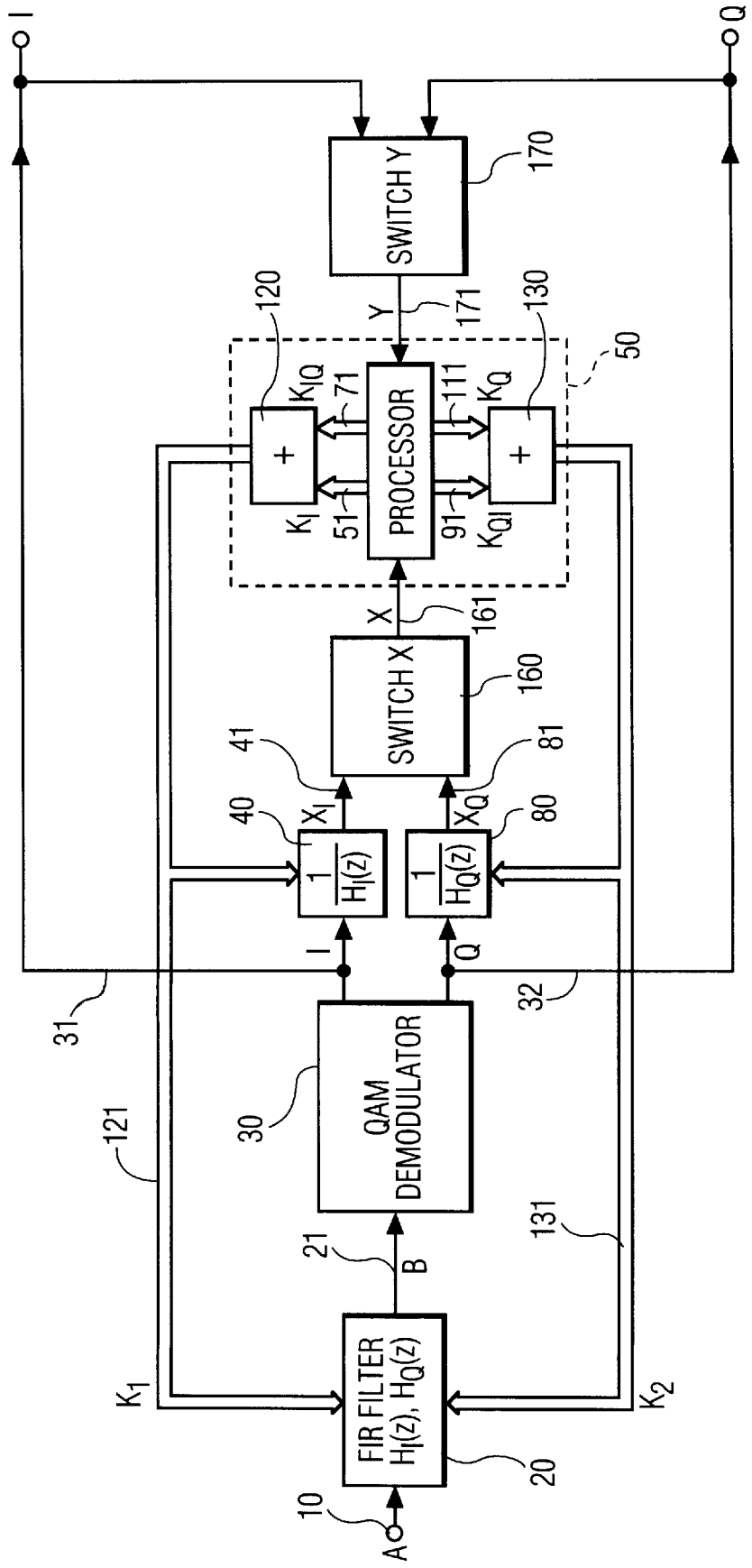
Figure 4:
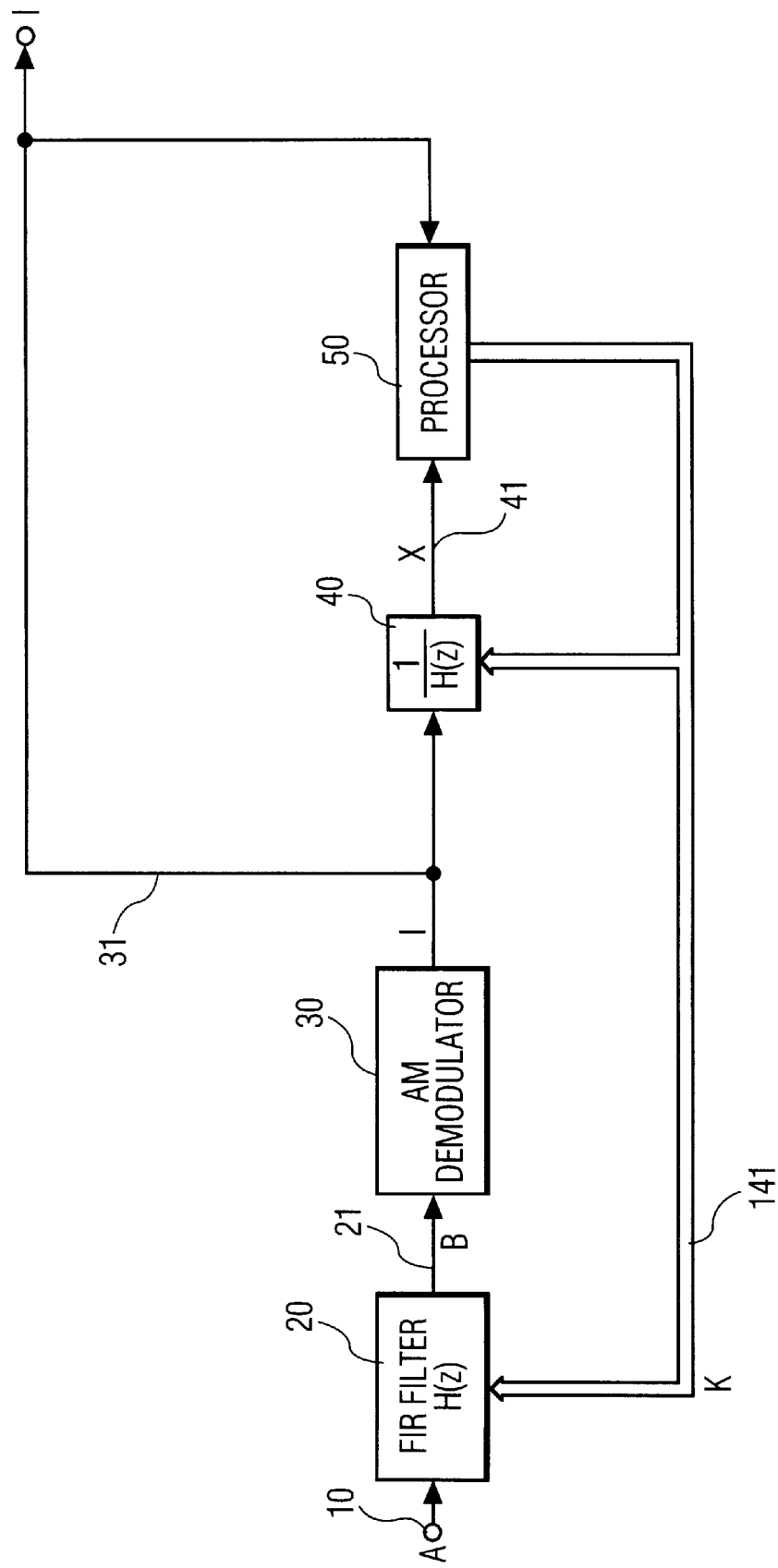
Figure 5:
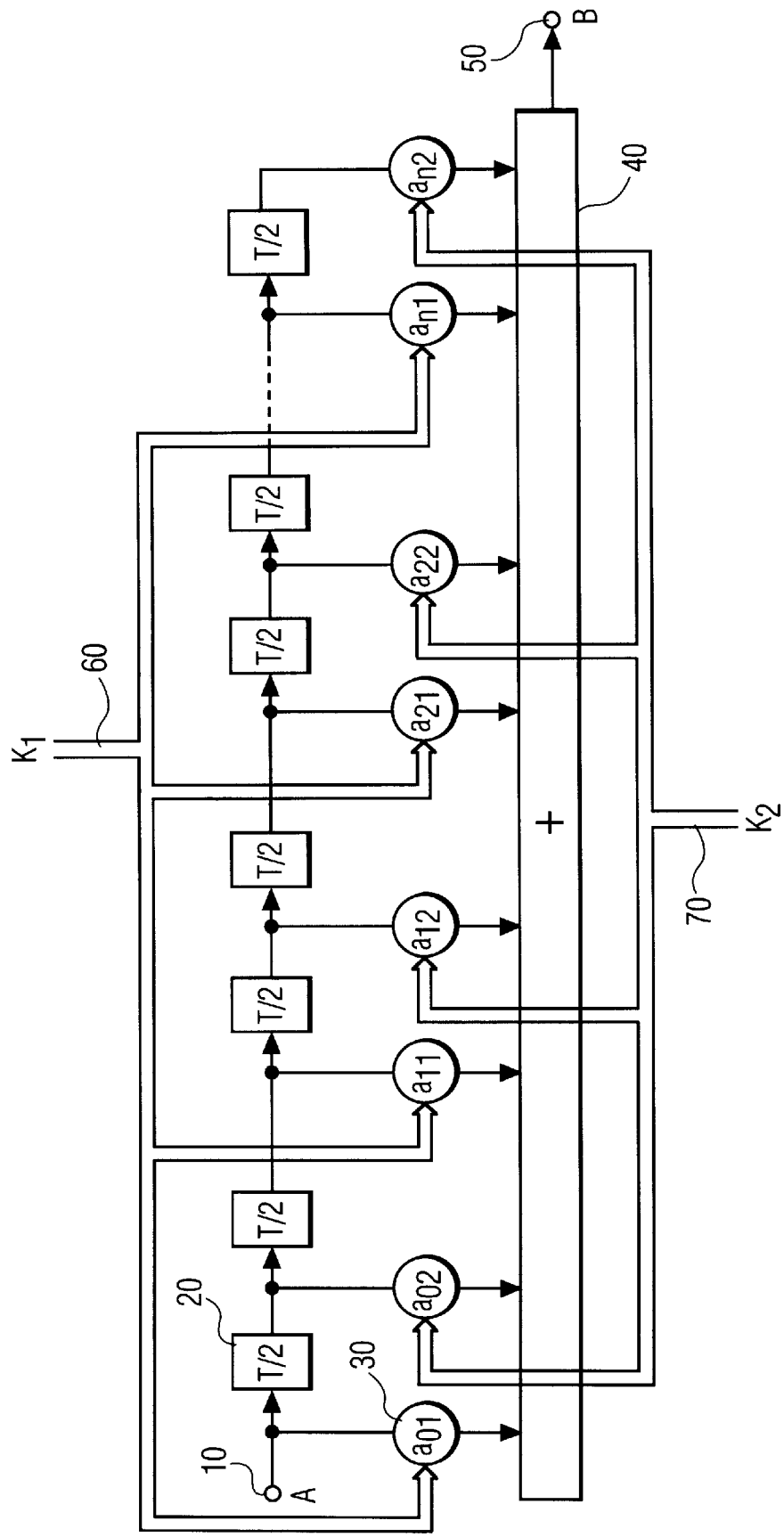

The invention is explained in more detail with the aid of the drawings, in which FIGS. 1 to 4 show block diagrams of exemplary embodiments of the equalizing arrangement according to the invention, and FIG. 5 shows a block diagram of a filter suitable for the arrangements according to FIGS. 1 to 4.

FIG. 1 shows an arrangement consisting of a non-recursive FIR filter 20 having the two component transfer functions $H_I(z)$ and $H_Q(z)$, a quadrature amplitude demodulator 30, an adder circuit 120, an adder circuit 130, a circuit 40 for converting the data stream I by means of the inverse filter transfer function $1/H_I(z)$, a circuit 60 for converting the data stream I likewise by means of the inverse filter transfer function $1/H_I(z)$, a circuit 80 for converting the data stream Q by means of the inverse filter transfer function $1/H_Q(z)$, a circuit 100, likewise for converting the data stream Q by means of the inverse filter transfer function $1/H_Q(z)$, a processor I 50 for the I component, a processor IQ 70 for the IQ component, a processor QI 90 for the QI component and a processor Q 110 for the Q component of the base band signal.

The input signal A 10 is a linearly distorted, in particular echo-distorted, quadrature amplitude modulated signal in the carrier frequency range. This signal 10 is the input signal of a settable non-recursive FIR filter 20 (Final Impulse Response, transverse filter), which has the structure according to FIG. 5. The filtered output signal B 21 of this settable non-recursive FIR filter 20 is the input signal of a quadrature amplitude demodulator 30, in which case the two output signals I 31 and Q 32, which are phase-shifted relative to one another by 90 degrees in each case, are produced by splitting the input signal and multiplying one component by the carrier signal $\sin(w_T t)$ and multiplying the other component by the carrier signal $\sin(w_T t+T/2)$. In this case, time constant T is the temporal spacing between two immediately adjacent symbols of the demodulated signal. One output signal I 31 of the QAM demodulator is the input signal into a circuit 40 for converting the data stream I by means of the inverse filter transfer function $1/H_I(z)$, of [sic] a circuit 60 for converting the data stream I by means of the inverse filter transfer function $1/H_I(z)$ and, at the same time, the output signal I of the arrangement. The component signal Q 32 is the input signal into a circuit 80 for converting the data stream I by means of the inverse filter transfer function $1/H_Q(z)$, a circuit 100 for converting the data stream Q by means of the inverse filter transfer function $1/H_Q(z)$ and, at the same time, the output signal Q of the arrangement. The circuits 40, 60, 80, 100 for converting the data stream I and Q by means of the inverse filter transfer function $1/H_I(z)$ and $1/H_Q(z)$ compensate for the circumstance that the non-recursive FIR filter 20 is arranged upstream of the demodulation and the linearly distorted input signal A 10 of the arrangement is not directly the base band input signal into the respective processor I 50, IQ 70, QI 90, Q 110. The non-recursive FIR filter 20 upstream of the demodulator also compensates for the demodulator distortions which do not occur in the demodulator until downstream of the FIR filter 20. The output signal of the circuit 40 is produced by convolution of the signal I by means of the inverse filter transfer function $1/H_I(z)$. The signal $X_I$ 41 and the signal $X_I$ 61 can be determined at the instances t from the signal I 31 by carrying out the differential equation in the following way:

$$X_I(t)=1/a_{01} \cdot (I(t)-a_{11} \cdot X_1(t-T)-X_I(t-2T)-\ldots -X_I(t-nT)).$$

The filter coefficients correspond in this case to the coefficient set $K_1$ at the instant k. The two signals $X_Q$ 81 and $X_Q$ 101 are produced in the same way from the signal Q 32, it being necessary to take $K_2$ at the instant k as the coefficient set. This differential equation represents a recursive IIR [sic] filter, and it can be realized as software in the processor 50, 70, 90, 110 respectively downstream, that is to say the circuit sections 40 and 50, 60 and 70, 80 and 90, 100 and 110 can also be regarded as a unit in terms of circuitry. The output signal $X_1$ 41 of the circuit for conversion 40 is the input signal into a processor 50. The second input into this processor 50 is the output signal I 31 of the arrangement. The input signal $X_1$ 61 of the processor 70 is the output signal of the circuit for conversion 60, and the second input signal 32 of the processor 70 is the output signal Q 32 of the arrangement. The output signal $X_Q$81 of the circuit for conversion 80 is the input signal into a processor 90. The second input into this processor 90 is the output signal I 31 of the arrangement. The first input signal $X_1$101 of the processor 110 is the output signal of the circuit for conversion 100, and the second input signal 32 of the processor 110 is the output signal Q 32 of the arrangement. The processors 50, 70, 90, 110 calculate the respective coefficient set $K_I$51, $K_I Q$71, $K_{QI}$91, $K_Q$111 for the FIR filter 20 according to FIG. 5 while carrying out an iteration algorithm, in particular one in which the [sic] the new (k+1)th coefficient set is produced from the kth coefficient set by subtraction of a correction value:

ai(k+1)=ai(k)−correction value.

This correction value is formed from the two input signals in the processor. An example for such an iteration algorithm may be specified as the least mean square algorithm with the following mathematical relationship:

$$a_1^{(k+1)}=a_1(k)-\mu \cdot (Yk-Yr) \cdot X_{k-1}$$

with the coefficient index I, the filter coefficient ai, the step size factor $\mu$, the instantaneous filter output value $y_k$, the reference value $y_r$ and the distorted input values $X_{k-1}$.

The calculated coefficient KI51 is the output signal of the processor I 50. It is led to the first input of an adder circuit 120. The second input signal of the adder circuit 120 is the output signal $K_{IQ}$ 71, the coefficient set calculated by the processor IQ 70. The adder circuit 120 respectively combines the components with the same index number of the two coefficient sets $K_I$ 51 and $K_{IQ}$ 71, and operates in accordance with the following rule:

$a_{01} = a_{0I} + a_{0IQ}$, $a_{02} = a_{0Q} + a_{0QI}$, $a_{11} = a_{1I} + a_{1IQ}$, $a_{12} = a_{1Q} + a_{1QI}$, $a_{21} = a_{2I} + a_{2IQ}$, $a_{22} = a_{2Q} + a_{2QI}$, etc.

$a_{n1} = a_{nI} + a_{nIQ}$, $a_{n2} = a_{nQ} + a_{nQI}$.

The output signal $K_1$ 121 is a new coefficient set, which controls the I part of the coefficients of the FIR filter 20 in accordance with FIG. 5 and forms the component transfer function $H_I(z)$. This signal 121 is also led to the conversion circuit 40. The other Q part of the coefficients of the FIR filter 20 is the new coefficient set $K_2$ 131, which is determined from the coefficient sets $K_{QI}$ 91 and $K_Q$ 111 in an equivalent way in the adder circuit 130 and which forms the component transfer function $H_Q(z)$. This signal 131 is also led to the conversion circuit 80.

Figure 2:
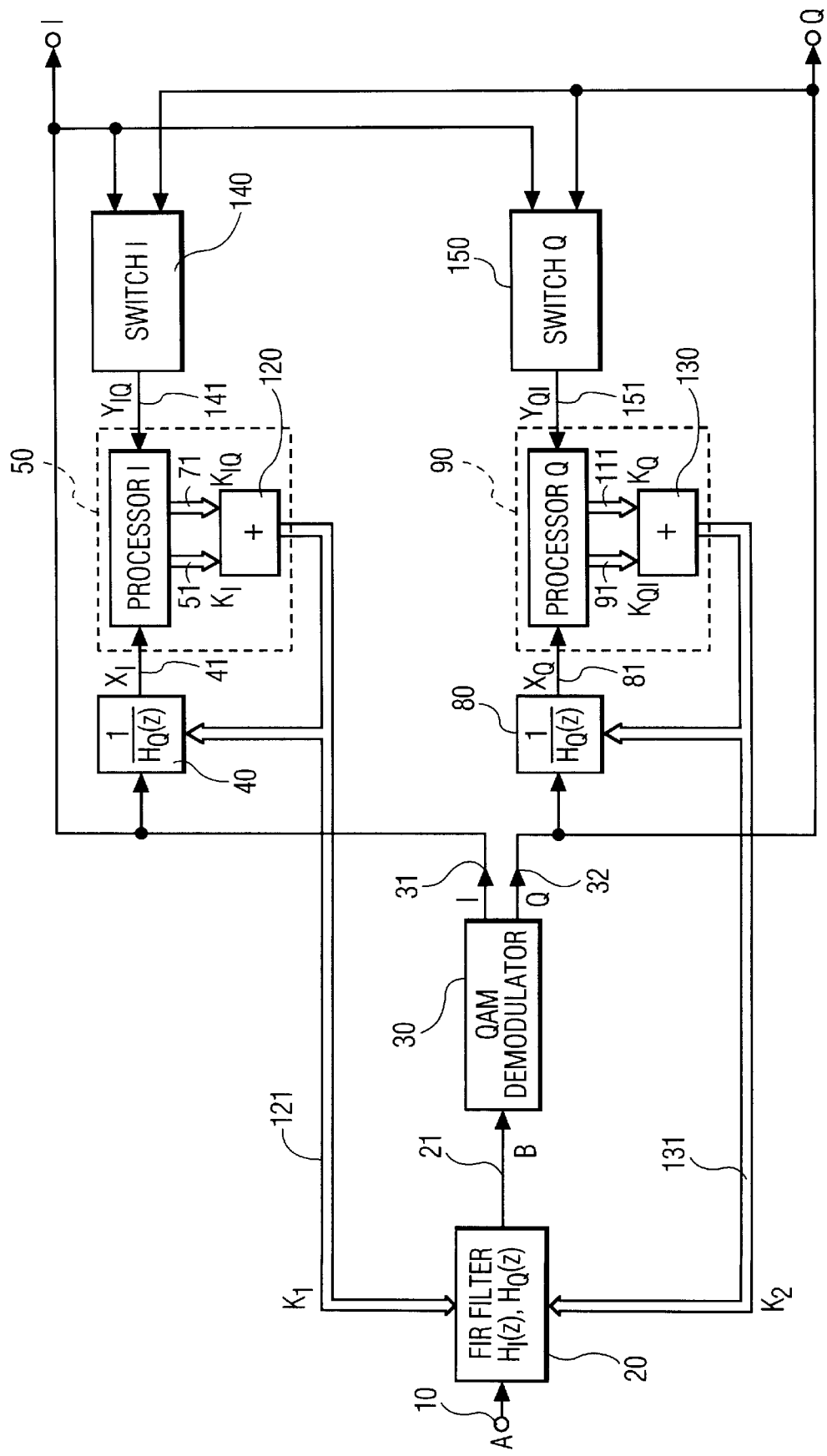

FIG. 2 shows an arrangement consisting of a nonrecursive FIR filter 20 having the two component transfer functions $H_I(z)$ and $H_Q(z)$, a QAM demodulator 30, a circuit 40 for the conversion of the data stream I by means of the inverse filter transfer function $1/H_I(z)$, a circuit 80 for the conversion of the data stream Q by means of the inverse filter transfer function $1/H_Q(z)$, a processor I 50 for I component, a processor Q 90 for the Q component, a switch I 140 for switching through the output signals I 31 and Q 32 of the arrangement to the second input of the processor I 50, a switch I 150 for switching through the output signals I 31 and Q 32 of the arrangement to the second input of the processor Q 90. The difference between FIG. 2 and FIG. 1 consists in a simplification such that the adder circuits 120 and 130 of FIG. 1 are eliminated and the coefficient sets $K_1$ 121 and $K_2$ 131 are already added to one another in the same way as in FIG. 1 in the respective processor I 50 and processor Q 90. Towards the outside, the arrangement of FIG. 2 behaves with reference to the signals A 10, I 31 and Q 32 exactly as the arrangement of FIG. 1. Furthermore, only two processors I 50 and Q 90 are required instead of the four processors I, IQ, QI and Q required in FIG. 1, and likewise only two upstream circuits 40 and 80 are required for the conversion of the data stream. The two processors I and Q of this FIG. 2 each inherently use time division multiplexing to process the respective iteration algorithm for the inputs I 31 and Q 32. In addition, by contrast with FIG. 1 there is a requirement in FIG. 2 for a switch I 140 and a switch Q 150 whose input signals are the output signal I 31 and Q 32 of the arrangement. The switching matrix for the switch I 140 can be, for example:

| Switch position | I | Q | $Y_{IQ}$ |
|---|---|---|---|
| 1 | L | O | L |
| 2 | O | L | L |

The switching matrix for the switch Q 150 can be, forexample:

| Switch position | I | Q | $Y_{QI}$ |
|---|---|---|---|
| 1 | O | L | L |
| 2 | L | O | L |

The two switch positions for the two switches are controlled synchronously with the symbol frequency of 1/T. Before each switch change, the coefficient set respectively calculated until then is buffered until the next coefficient set is calculated. Then, the two coefficient sets $K_I$ 51, $K_{IQ}$ 71 are added in the processor I to the new coefficient set $K_I$ 121, and the two coefficient sets $K_{QI}$ 91, $K_Q$ 111 are added in the processor Q to the new coefficient set $K_2$ 131, as described in FIG. 1.

FIG. 3 shows an arrangement consisting of a nonrecursive FIR filter 20 having the two component transfer functions $H_I(z)$ and $H_Q(z)$, a QAM demodulator 30, a circuit 40 for the conversion of the data stream I by means of the inverse filter transfer function $1/H_I(z)$, a circuit 80 for the conversion of the data stream Q by means of the inverse filter transfer function $1/H_Q(z)$, a processor 50, a switch X 160 for switching through the output signals $X_I$ 41 and $X_Q$ 81 of the two conversion circuits 40 and 80 to a first input of the processor 50, and a switch Y 170 for switching through the output signals I 31 and Q 32 of the arrangement. The arrangement of FIG. 3 is further simplified by comparison with FIG. 2. The output signal 161 of the switch X 160 is the second input signal of the processor 50. The difference between FIG. 3 and FIG. 1 consists in a further simplification such that the adder circuits 120 and 130 of FIG. 1 are eliminated and the coefficient sets are already added to one another in the processor 50 in the same way. Towards the outside, the arrangement of FIG. 3 behaves with respect to the signals A 10, I 31 and Q 32 exactly as the arrangement of FIG. 1. Furthermore, as a further simplification by comparison with FIG. 2, only one processor 50 is required instead of the four processors I, IQ, QI and Q required in FIG. 1, in conjunction likewise with only two upstream circuits 40 and 80 for the conversion of the data stream. The processor 50 of this FIG. 3 processes the respective iteration algorithm by time division multiplexing for the different input signals X 161 and Y 171. In addition, by contrast with FIG. 1 a switch X 160 and a switch Y 170 are required in FIG. 3. The switching matrix for the switch X 160 can be, for example:

Switch position XI XQ X

| Switch position | XI | XQ | X |
|---|---|---|---|
| 1 | L | O | L |
| 2 | L | O | L |
| 3 | O | L | L |
| 4 | O | L | L |

The switching matrix for the switch Y 170 can be, for example:

| Switch position | I | Q | Y |
|---|---|---|---|
| 1 | L | O | L |
| 2 | O | L | L |
| 3 | O | L | L |
| 4 | L | O | L |

The four switch positions for the two switches are controlled synchronously with the symbol frequency of 1/T. Before each switch change, the coefficient set respectively calculated until then is buffered until the next coefficient set is calculated. Then, the two coefficient sets $K_I$ 51, $K_{IQ}$ 71 are added in the processor to the new coefficient set K1 121, and the two next coefficient sets $K_{QI}$ 91, KQ111 are added in the processor Q to the new coefficient set $K_2$ 131, as described in FIG. 1. The two new coefficient sets K1 and K2 are led to the FIR filter 20.

FIG. 4 shows an arrangement consisting of a non-recursive FIR filter 20 having the transfer function H(z), an amplitude modulator 30, a circuit 40 for the conversion of the data stream I by means of the inverse filter transfer function 1/H(z), and a processor 50. The arrangement of FIG. 4 is further simplified by comparison with FIG. 1, FIG. 2 and FIG. 3 and is a purely amplitude-modulated special case for the signal Q equal to zero. The other component Q can also be equal to zero, and in this case the data stream is then Q 31. The output signal 41 of the circuit 40 for conversion is an input of the processor 50. The second input signal of the processor is the output signal 31 of the arrangement. The processor of this FIG. 4 does not operate using time division multiplexing, but using only the iteration algorithm for the two input signals X 41 and I 31. Consequently, the result is also only a coefficient set K 141 which is fed to the circuit 40 and to the non-recursive FIR filter 20. Since the Q component or the Q components of the output signal of the arrangement is/are equal to zero, likewise only the I coefficients $a_{01}, a_{11}, a_{21}, a_{31}, \ldots, an1$ are set in the non-recursive FIR filter 20 of FIG. 5, and all the other coefficients $a_{02}, a_{12}, a_{22}, a_{32}, \ldots, a_{n2}$ are permanently zero. This is synonymous with a non-recursive FIR filter which has only a time delay of T from coefficient to coefficient.

The arrangement of FIG. 5 comprises $2 \cdot (n+1)$ similar multiplier circuits 30 and $2 \cdot (n+1)$ similar time-delay circuits 20 and an adder circuit 40. The input signal A 10 is split into $2 \cdot (n+1)$ component signals, and each component signal is led respectively via a time-delay circuit 20 and a multiplier circuit 30. All $2 \cdot (n+1)$ component signals are added jointly in the adder circuit 40. The coefficients $a_{01}, a_{11}, a_{21}, a_{31}, \ldots, a_{n1}$ are set as multipliers of the arrangement by means of the coefficient set K1 60. The coefficients $a_{02}, a_{12}, a_{22}, a32, \ldots, an2$ are set as multipliers of the arrangement by means of the coefficient set K2 70. The output signal B 50 of the arrangement is produced by addition of the $2 \cdot (n+1)$ component signals which is weighted by the multipliers 30 and delayed by the time constant T/2 20. The time constant T corresponds to the temporal spacing between the occurrence of immediately adjacent symbols in the base band. For the user, the FIR filter of FIG. 5 operates towards the outside with double the frequency $2 \cdot fT$ by comparison with the clock frequency $fT=1/T$ in the base band. This corresponds to oversampling by the factor 2. The output signal B 50 of the arrangement is thus at time t:

$$B(t)=a_{01}A(t)+a_{02}A(t-T/2)+a_{11}A(t-T)+a_{12}A(t-3T/2)+\ldots+a_{n2}A(t-nT).$$

For the special case of the amplitude modulation of FIG. 4, the coefficients $a_{02}, a_{12}, a_{22}, a_{32}, \ldots, a_{n2}$ are all identically zero, and the temporal spacing between the component signals is therefore T instead of T/2 in the case of quadrature amplitude modulation.

We claim:

1. A system for equalizing an input signal including a datastream modulated on a carrier, with respect to both transmission channel distortions and local receiver distortions, the system including:

a network for frequency downshifting the input signal (to IF);

a controlled non-recursive filter (20) for receiving the frequency downshifted input signal;

a demodulator (30) for receiving an output signal from the controlled filter;

a signal processing network, including a filter network with a transfer function (40,60,80,100) which is the inverse of the transfer function of the controlled filter, responsive to an output signal from the demodulator (30) for producing output control signals; and means for coupling the control signals to a coefficient control input of said non-recursive filter for equalizing the signal with respect to both transmission channel and receiver distortion.

2. Apparatus for equalizing two data streams (I, Q) which are modulated in quadrature relative to one another on a common carrier, one of the two data streams subject to being zero, in particular data streams which are transmitted via broadband cables or radio links, comprising:

a demodulator responsive to the quadrature modulated data streams for producing demodulated data streams;

a controllable non-recursive filter located in the signal path upstream of the demodulator for providing filtered modulated data streams to the demodulator, wherein the demodulated data streams (I, Q) from the demodulator are coupled to the non-recursive filter for controlling the non-recursive filter; and wherein the demodulator produces first and second demodulated data streams, and control of the non-recursive filter is produced in response to:

(a) a first filter coefficient set generated at instant k+1 in response to combined first and second control signals, where (a1) the first control signal is derived from a first demodulated data stream and a convolution product formed from the first demodulated data stream and the first coefficient set at instant k, and (a2) the second control signal being derived from a second data stream and a convolution product formed from the first demodulated data stream and the first coefficient set at instant k; and (b) a second filter coefficient set generated at instant k+1 in response to combined third and fourth control signals, where (b1) the third control signal is derived from the first demodulated data stream and a convolution product formed from the second demodulated data stream and the second coefficient set at the instant k, and (b2) the fourth control signal is derived from the second demodulated data stream and a convolution product formed from the second demodulated data stream and the second coefficient set at instant k.

3. Apparatus for equalizing two data streams (I, Q) which are modulated in quadrature relative to one another on a common carrier, one of the two data streams subject to being zero, in particular data streams which are transmitted via broadband cables or radio links, comprising:

a demodulator responsive to the quadrature modulated data streams for producing demodulated data streams;

a controllable non-recursive filter located in the signal path upstream of the demodulator for providing filtered modulated data streams to the demodulator, wherein the demodulated data streams (I, Q) from the demodulator are coupled to the non-recursive filter for controlling the non-recursive filter;

one of the data streams is zero, and wherein for the control of the non-recursive filter a coefficient set for the filter is derived at the instant k+1 from the accumulated data stream and a convolution product which is formed from the demodulated data stream and the coefficient set at the instant k.

\* \* \* \* \*